United States Patent
Kawai et al.

(10) Patent No.: US 9,947,833 B2
(45) Date of Patent: Apr. 17, 2018

(54) SEMICONDUCTOR LIGHT-EMITTING ELEMENT AND SEMICONDUCTOR LIGHT-EMITTING DEVICE

(71) Applicant: STANLEY ELECTRIC CO., LTD., Meguro-ku, Tokyo (JP)

(72) Inventors: Ryosuke Kawai, Yokohama (JP); Mamoru Miyachi, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/157,102

(22) Filed: May 17, 2016

(65) Prior Publication Data
US 2016/0343907 A1    Nov. 24, 2016

(30) Foreign Application Priority Data

May 22, 2015    (JP) .................................. 2015-104538

(51) Int. Cl.
  *H01L 29/18* (2006.01)
  *H01L 33/38* (2010.01)
  *H01L 25/075* (2006.01)

(52) U.S. Cl.
  CPC ........ *H01L 33/382* (2013.01); *H01L 25/0753* (2013.01)

(58) Field of Classification Search
  CPC .......................... H01L 33/382; H01L 25/0753
  See application file for complete search history.

(56) References Cited

U.S. PATENT DOCUMENTS

| | | | |
|---|---|---|---|
| 8,188,687 B2 | 5/2012 | Lee et al. | |
| 8,395,332 B2 | 3/2013 | Lee et al. | |
| 8,716,946 B2 | 5/2014 | Lee et al. | |
| 8,860,331 B2 | 10/2014 | Lee et al. | |
| 8,866,417 B2 | 10/2014 | Lee et al. | |
| 9,030,110 B2 | 5/2015 | Lee et al. | |
| 2014/0014990 A1* | 1/2014 | Kim ..................... | H01L 33/58 257/98 |
| 2015/0195872 A1 | 7/2015 | Lee et al. | |

FOREIGN PATENT DOCUMENTS

| | | | |
|---|---|---|---|
| JP | 2014-007001 | * | 1/2014 |
| JP | 2014195123 A | | 10/2014 |

* cited by examiner

*Primary Examiner* — Dale E Page
*Assistant Examiner* — Wasiul Haider
(74) *Attorney, Agent, or Firm* — Holtz, Holtz & Volek PC

(57) ABSTRACT

A semiconductor light-emitting element comprises: a semiconductor structure layer including a first semiconductor layer having a first conductivity type, a light-emitting layer and a second semiconductor layer having a second conductivity type opposite to the first conductivity type being laminated in sequence; a first electrode including a first electrode layer formed on the first semiconductor layer and a first contact electrode connected to the first electrode layer at a position displaced from a center of the first electrode layer in an intra-layer direction of the first electrode layer; and a second electrode extending through the first electrode layer, the first semiconductor layer and the light-emitting layer and being connected to the second semiconductor layer.

9 Claims, 6 Drawing Sheets

SEMICONDUCTOR LIGHT-EMITTING ELEMENT AND SEMICONDUCTOR LIGHT-EMITTING DEVICE

BACKGROUND OF THE INVENTION

1. Field of the Invention

The present invention relates to a semiconductor light-emitting element such as a light-emitting diode (LED) and a semiconductor light-emitting device including a plurality of semiconductor light-emitting elements.

2. Description of the Related Art

Semiconductor light-emitting elements are generally fabricated by growing a semiconductor structure layer having an n-type semiconductor layer, a light-emitting layer and a p-type semiconductor layer on a growth substrate, and forming an n-electrode and a p-electrode that apply voltage to the n-type semiconductor layer and the p-type semiconductor layer, respectively. Furthermore, semiconductor light-emitting elements with improved heat dissipation performance are known. The semiconductor light-emitting elements are formed by joining a semiconductor structure layer formed on a growth substrate to a support substrate other than the growth substrate, and then removing the growth substrate. Semiconductor light-emitting devices are fabricated by fixing a plurality of semiconductor light-emitting elements on a mounting substrate, further forming a phosphor layer for wavelength conversion, and then packaging an entire body by a resin and the like. Japanese Patent Application Laid-Open No. 2014-195123 discloses an AC semiconductor light-emitting element having an array of light-emitting cells connected in series.

SUMMARY OF THE INVENTION

For example, in the field of lighting apparatuses such as vehicle lamps, it is sometimes required to arrange light distribution so that some irradiated area is brighter than other areas. To meet such a requirement, a light source is configured so that the irradiated area includes a high-luminance region and a low-luminance region for example. In this case, in consideration of providing a vehicle driver with comfortable visibility, it is preferable to gradually vary the luminance on a boundary between the high-luminance region and the low-luminance region. That is, it is preferable to form a luminance gradation region (inclination region) between the high-luminance region and the low-luminance region. On the other hand, in view of ensuring visibility of the entire irradiated area, it is preferable to impart a high luminance to the entire irradiation area.

The present invention has been made in view of the above-described points, and it is therefore an object of the present invention to provide a semiconductor light-emitting element and a semiconductor light-emitting device having high light-extraction efficiency and capable of forming a luminance gradation.

A semiconductor light-emitting element according to the present invention includes: a semiconductor structure layer including a first semiconductor layer having a first conductivity type, a light-emitting layer and a second semiconductor layer having a second conductivity type opposite to the first conductivity type being laminated in sequence; a first electrode including a first electrode layer formed on the first semiconductor layer and a first contact electrode connected to the first electrode layer at a position displaced from a center of the first electrode layer in an intra-layer direction of the first electrode layer; and a second electrode extending through the first electrode layer, the first semiconductor layer, and the light-emitting layer and being connected to the second semiconductor layer.

A semiconductor light-emitting device according to the present invention includes: a substrate; and a plurality of semiconductor light-emitting elements arrayed in a matrix form on the substrate, the semiconductor light-emitting elements each having a semiconductor structure layer configured to include a first semiconductor layer having a first conductivity type, a light-emitting layer and a second semiconductor layer having a second conductivity type opposite to the first conductivity type being laminated in sequence, and first and second electrodes connected to the first and second semiconductor layers, wherein among the plurality of semiconductor light-emitting elements, the first electrode in at least one semiconductor light-emitting element at an end portion includes: a first electrode layer formed on the first semiconductor layer; and a first contact electrode connected to the first electrode layer at a position displaced from a center of the first electrode layer in an intra-layer direction of the first electrode layer, and the second electrode in the at least one semiconductor light-emitting element includes: a second electrode layer provided between the substrate and the first electrode layer; and a plurality of via-electrodes extending from the second electrode layer and through the first electrode layer, the first semiconductor layer, and the light-emitting layer and being connected to the second semiconductor layer.

DETAILED DESCRIPTION OF THE INVENTION

Hereinbelow, embodiments of the present invention will be described in detail.

[First Embodiment]

Figure 1A:
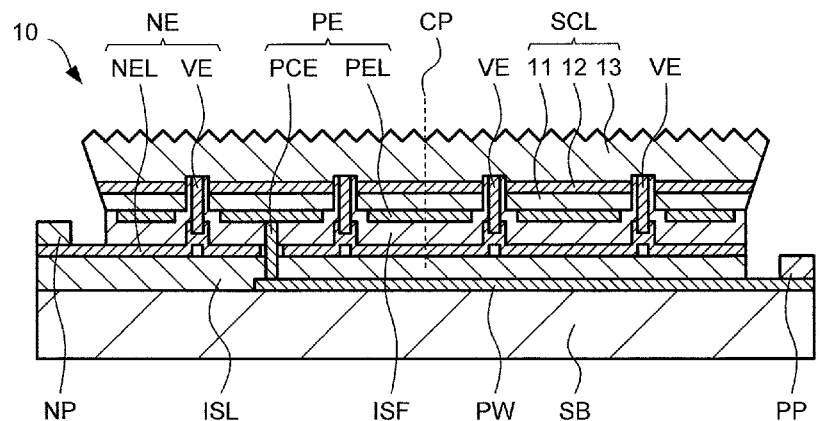
FIG. 1A is a cross-sectional view of a semiconductor light-emitting element according to a first embodiment.

FIG. 1A is a cross-sectional view of a semiconductor light-emitting element (hereinafter simply referred to as a light-emitting element) 10 according to a first embodiment. The light-emitting element 10 includes a semiconductor structure layer SCL, a p-electrode (first electrode) PE, and an n-electrode (second electrode) NE. The semiconductor structure layer SCL includes a p-type semiconductor layer (first semiconductor layer having a first conductivity type) 11, a light-emitting layer 12, and an n-type semiconductor layer (second semiconductor layer having a second conductivity type opposite to the first conductivity type) 13. For example, the semiconductor structure layer SCL is configured to include the p-type semiconductor layer 11 having a composition of $Al_xIn_yGa_{1-x-y}N$ ($0 \leq x \leq 1$, $0 \leq y \leq 1$), the light-emitting layer 12, and the n-type semiconductor layer 13 laminated in sequence on the mounting substrate SB (hereinafter simply referred to as a substrate). The surface of the n-type semiconductor layer 13 functions as a light extraction surface.

The light-emitting element 10 also includes a p-side pad terminal (first terminal) PP and an n-side pad terminal (second terminal) NP provided on the substrate SB to supply electric power to the p-electrode PE and the n-electrode NE, respectively. The p-side pad terminal PP and the n-side pad terminal NP are connected to an external power supply (not illustrated) through a bonding wire (not illustrated), for example. The p-electrode PE and the n-electrode NE are connected to the p-type and n-type semiconductor layers 11 and 13, respectively.

The p-electrode PE includes a p-electrode layer (first electrode layer) PEL formed on the p-type semiconductor layer 11 so as to coat the surface of the p-type semiconductor layer 11. The p-electrode PE includes a p-side contact electrode (first contact electrode) PCE connected to the p-electrode layer PEL between the substrate SB and the semiconductor structure layer SCL. On the substrate SB, a p-side wiring PW wired from the p-side pad terminal PP to the p-electrode layer PEL is provided. The p-side wiring PW is wired from the p-side pad terminal PP to the p-electrode layer PEL through the p-side contact electrode PCE.

The n-electrode NE includes a plurality of via-electrodes VE extending through the p-type semiconductor layer 11 and the light-emitting layer 12 between the substrate SB and the semiconductor structure layer SCL and being connected to the n-type semiconductor layer 13. The n-electrode NE also includes an n-electrode layer (second electrode layer) NEL formed between the substrate SB and the p-electrode layer PEL and connected to the plurality of via-electrodes VE. That is, the n-electrode NE extends through the p-electrode layer PEL, the p-type semiconductor layer 11, and the light-emitting layer 12 and is connected to the n-type semiconductor layer 13. The n-electrode layer NEL is connected to the n-side pad terminal NP.

In the present embodiment, the p-side wiring PW is formed on the substrate SB, and an insulating layer ISL is formed on the p-side wiring PW. On the insulating layer ISL, the n-electrode layer NEL is formed. On the n-electrode layer NEL, an insulating film ISF is formed. On the insulating film ISF, the p-electrode layer PEL is formed. The p-side contact electrode PCE extends from the p-electrode layer PEL and through the insulating film ISF, the n-electrode layer NEL, and the insulating layer ISL, and is connected to the p-side wiring PW.

The p-side wiring PW and the n-electrode layer NEL are three-dimensionally formed so as to be in different hierarchies across the insulating layer ISL between the substrate SB and the semiconductor structure layer SCL. The n-electrode layer NEL and the p-electrode layer PEL are three-dimensionally formed so as to be in different hierarchies across the insulating film ISF between the substrate SB and the semiconductor structure layer SCL. That is, the n-electrode layer NEL is formed on the p-electrode layer PEL through the insulating film ISF. The insulating layer ISL and the insulating film ISF are comprised of an insulating material such as $SiO_2$, for example.

The p-electrode layer PEL is formed of a multilayered metal layer including a reflective metal layer (not illustrated) and a cap layer (not illustrated) laminated on the p-type semiconductor layer 11, for example. The reflective metal layer is comprised of, for example, a metal material such as Ag, Pt, Ni, Al, or Pd, or an alloy containing the same. The cap layer is formed by using a metal material less likely to cause migration, such as Ti, W, Pt, Pd, Mo, Ru, Ir, or Au, for example. A metal oxide film, such as ITO or IZO, may be formed between the p-type semiconductor layer 11 and the reflective metal layer to enhance optical reflexibility. The via-electrodes VE are formed by using a metal material such as Ti, Al, Pt, or Au. For example, the n-electrode layer NEL is formed by using a metal material such as Ti, Pt, or Au.

As illustrated in FIG. 1A, the p-side contact electrode PCE is connected to the p-electrode layer PEL at a position displaced (biased) from a center (central point) CP of the p-electrode layer PEL in an intra-layer direction of the p-electrode layer PEL. Therefore, the p-side contact electrode PCE is formed at a displaced position on the semiconductor structure layer SCL. The p-side wiring PW is connected to the p-electrode layer PEL at a displaced position in the intra-layer direction of the semiconductor structure layer SCL. For example, the p-side contact electrode PCE is preferably formed at a position within a distance of ⅓, preferably within a distance of ¼, of the length of the semiconductor structure layer SCL in a displacement direction from an end portion of the semiconductor structure layer SCL in the displacement direction.

In the present embodiment, the p-side contact electrode PCE is formed at a position displaced in a direction away from the p-side pad terminal PP in the intra-layer direction of the p-electrode layer PEL. The n-side pad terminal NP is formed at a position facing the p-side pad terminal PP across the semiconductor structure layer SCL. Therefore, the p-side contact electrode PCE is formed at a displaced position in a direction approaching the n-side pad terminal NP in the intra-layer direction of the semiconductor structure layer SCL.

Figure 1B:
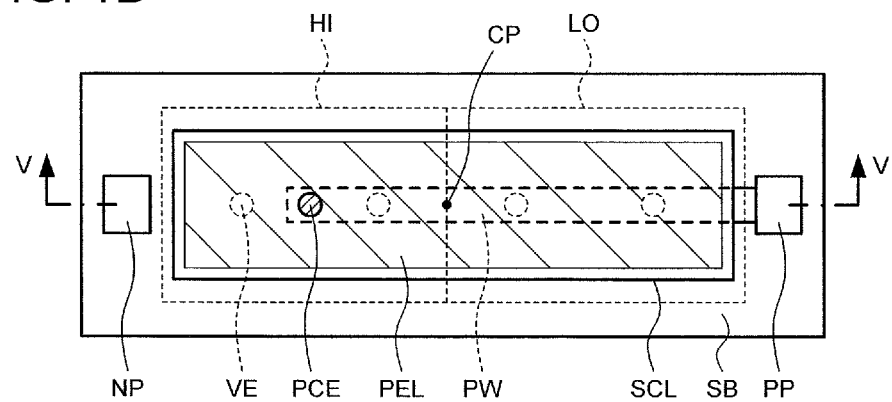
FIGS. 1B and 1C are schematic views illustrating an upper surface of the semiconductor light-emitting element of the first embodiment.
Figure 1C:
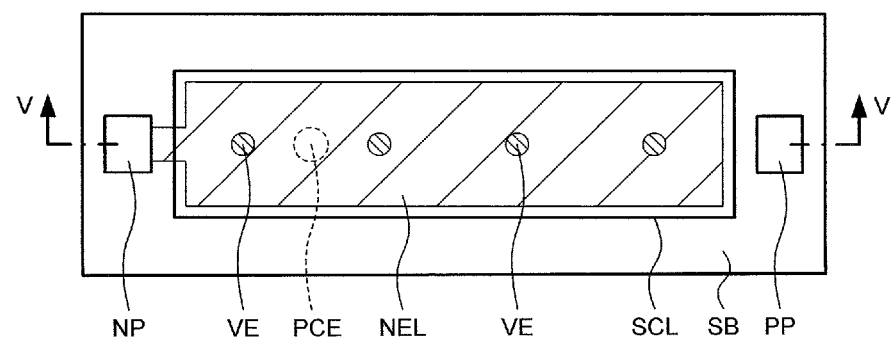

FIGS. 1B and 1C are schematic views illustrating the upper surface of the light-emitting element 10. FIG. 1A is a cross-sectional view taken along V-V line in FIGS. 1B and 1C. FIG. 1B schematically illustrates not only the upper surface of the light-emitting element 10, but also formation regions of the p-electrode layer PEL, the p-side contact electrode PCE, the p-side wiring PW, and the via-electrodes VE. For the clarity of the drawing, hatching is applied to the formation regions of the p-electrode layer PEL and the p-side contact electrode PCE, and the formation regions of the p-side wiring PW and the via-electrodes VE in the lower layer of the semiconductor structure layer SCL are illustrated with broken lines.

First, in the present embodiment, the semiconductor structure layer SCL has a rectangular shape as viewed from a direction perpendicular to the semiconductor structure layer SCL. The p-side pad terminal PP and the n-side pad terminal NP face each other across the semiconductor structure layer SCL in a longitudinal direction of the semiconductor structure layer SCL. Four via-electrodes VE are formed at regular intervals along the longitudinal direction of the semiconductor structure layer SCL. The p-side contact electrode PCE is formed between two via-electrodes VE on the n-side pad terminal NP side, among the four via-electrodes VE.

As illustrated in FIG. 1B, the p-electrode layer PEL is formed so as to cover almost the entire p-type semiconductor layer 11 except the formation region of the via-electrodes VE. Therefore, a current supplied from the p-side pad terminal PP and through the p-side wiring PW and the p-side contact electrode PCE to the p-electrode layer PEL diffuses to the entire p-electrode layer PEL, and is then injected into the p-type semiconductor layer 11. That is, the p-electrode layer PEL functions as a current diffusion layer (first current diffusion layer).

Next, the n-electrode layer NEL and the via-electrodes VE will be described with reference to FIG. 1C. In FIG. 1C, for clarity of the drawings, hatching is applied to the formation regions of the n-electrode layer NEL and the via-electrodes VE, and the formation region of the p-side contact electrode PCE is illustrated with a broken line. First, the n-electrode layer NEL is formed on almost an entire region between the semiconductor structure layer SCL and the substrate SB except the formation region of the p-side contact electrode PCE. In the present embodiment, four via-electrodes VE are uniformly distributed in the intra-layer direction of the semiconductor structure layer SCL. Therefore, a current passing through the n-type semiconductor layer 13 diffuses in the n-electrode layer NEL through all the via-electrodes VE and then flows toward the n-side pad terminal NP. That is, the n-electrode layer NEL functions as a current diffusion layer (second current diffusion layer).

Next, the p-side contact electrode PCE will be described with reference to FIG. 1B again. The p-side contact electrode PCE is formed at a position displaced from the center CP of the p-electrode layer PEL in the intra-layer direction of the p-electrode layer PEL. Therefore, a point of injecting the current into the p-electrode layer PEL is formed at a displaced position in the intra-layer direction of the semiconductor structure layer SCL (p-type semiconductor layer 11). This hinders uniform injection of the current into the intra-layer direction of the light-emitting layer 12. Therefore, the light emitted from the light-emitting layer 12 is different in amount in the surface of the light-emitting layer 12.

Specifically, light with relatively high luminance is emitted from a region of the light-emitting layer 12 in the vicinity of the p-side contact electrode PCE (on the left side of the center CP in the drawing) in the intra-layer direction of the semiconductor structure layer SCL. Meanwhile, light with relatively low luminance is emitted from a region of the light-emitting layer 12 away from the p-side contact electrode PCE (on the right side of the center CP in the drawing). Therefore, a relatively bright region (high-luminance region) H1 and a relatively dark region (low-luminance region) L0 are formed in the light-emitting element 10. Since the light is uninterruptedly emitted from the light-emitting layer 12, the luminance of the light emitted from the light-emitting layer 12 continuously changes. This makes it possible to intentionally form a luminance inclination (gradation) on the light extraction surface (the surface of the n-type semiconductor layer 13 in the present embodiment).

Since both the p-electrode PE and the n-electrode NE are formed between the substrate SB and the semiconductor structure layer SCL (on the p-type semiconductor layer 11 side in the semiconductor structure layer SCL), a metal material which can intercept passage of light is not formed on the surface of the n-type semiconductor layer 13. Therefore, light can be extracted from the entire surface of the n-type semiconductor layer 13 that serves as a light extraction surface. This makes it possible to suppress formation of a dark part in an irradiation image.

In the present embodiment, the semiconductor structure layer SCL has a rectangular shape as viewed from the direction perpendicular to the semiconductor structure layer SCL. As illustrated in FIGS. 1B and 1C, the p-side contact electrode PCE is formed at a position displaced from the center of the p-electrode layer PEL along the longitudinal direction of the semiconductor structure layer SCL. Therefore, a large luminance inclination is formed in the longitudinal direction of the semiconductor structure layer SCL.

Moreover, in the present embodiment, the n-electrode NE is comprised of an n-electrode layer NEL and via-electrodes VE. The n-electrode NE is pulled out from a position (vicinity of high-luminance region HI) of the semiconductor structure layer SCL (n-type semiconductor layer 13) displaced in a direction identical to the displacement direction of the p-side contact electrode PCE. That is, the n-electrode layer NEL is pulled out so as to form a current path in a direction toward the p-side contact electrode PCE from the center CP of the n-electrode layer NEL in the intra-layer direction of the n-electrode layer NEL. Therefore, the current tends to concentrate in the region of the light-emitting layer 12 in the vicinity of the p-side contact electrode PCE. As a result, a larger luminance gradation is formed.

In the present embodiment, it has been described that the p-side and n-side pad terminals PP and NP are formed on the substrate SB so that they face each other across the semiconductor structure layer SCL. However, the p-side and n-side pad terminals PP and NP may be formed at other positions.

Although it has been described that the n-electrode NE includes the n-electrode layer NEL and the via-electrodes VE, the n-electrode NE is not limited to the configuration of including the n-electrode layer NEL and the via-electrodes VE so long as the n-electrode NE extends through the p-electrode layer PEL, the p-type semiconductor layer 11, and the light-emitting layer 12 between the substrate SB and the semiconductor structure layer SCL, and is connected to the n-type semiconductor layer 13. This makes it possible to supply the amount of current injected into the light-emitting layer 12 in a biased manner, so that a fixed luminance inclination can be formed.

Although it has been described that the semiconductor structure layer SCL has a rectangular plane shape, the plane shape of the semiconductor structure layer SCL is not limited to the rectangular plane shape. Although it has been described that the p-side pad terminal PP and the p-side contact electrode PCE (p-electrode PE) are connected through the p-side wiring PW, the p-electrode PE and the p-side pad terminal PP may be connected in other forms. Although it has been described that the n-side pad terminal NP is directly connected to the n-electrode layer NEL (n-electrode NE), the n-side pad terminal NP and the n-electrode NE may be connected in other forms.

As illustrated in FIG. 1A, forming an uneven structure on the surface (light extraction surface) of the n-type semiconductor layer 13 enables larger amount of light to pass through the uneven structure. As a result, the light extraction efficiency can be improved. Although it has been described that the first and second semiconductor layers are a p-type semiconductor layer and an n-type semiconductor layer, respectively, in the present embodiment, the conductivity type of the first and second semiconductor layers may be reversed. That is, the first semiconductor layer may have an n-type conductivity type, and the second semiconductor layer may have a p-type conductivity type.

In the present embodiment, the p-electrode PE includes a p-electrode layer PEL and a p-side contact electrode PCE connected to a displaced position of the p-electrode layer PEL. The n-electrode NE extends through the p-electrode layer PEL, the p-type semiconductor layer 11, and the light-emitting layer 12 between the substrate SB and the semiconductor structure layer SCL, and is connected to the n-type semiconductor layer 13. This makes it possible to secure current injection into the entire light-emitting layer 12, while intentionally supplying the current injection into the light-emitting layer 12 in a biased manner. Therefore, the light-emitting element 10 having a luminance distribution (gradation) can be obtained. As a result, irradiation light with a large luminance gradation can be obtained.

[Second Embodiment]

Figure 2A:
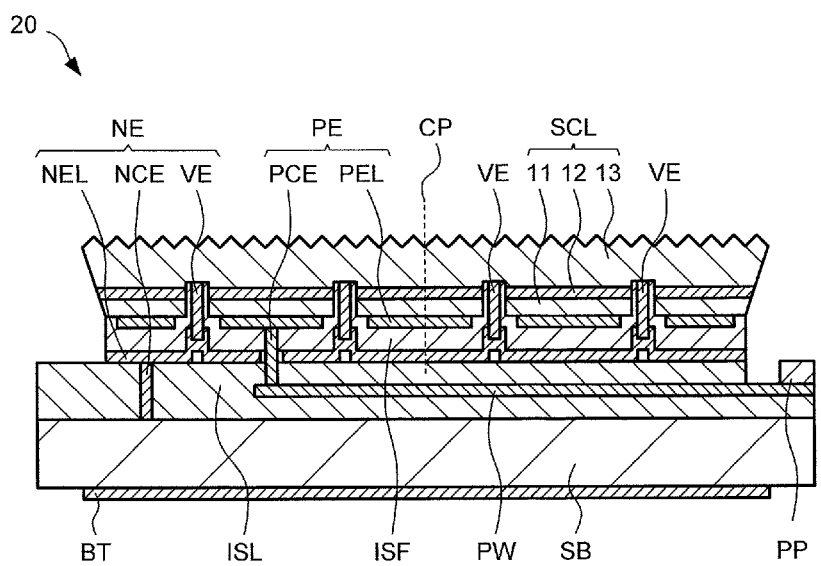
FIG. 2A is a cross-sectional view illustrating a semiconductor light-emitting element according to a second embodiment.
Figure 2B:
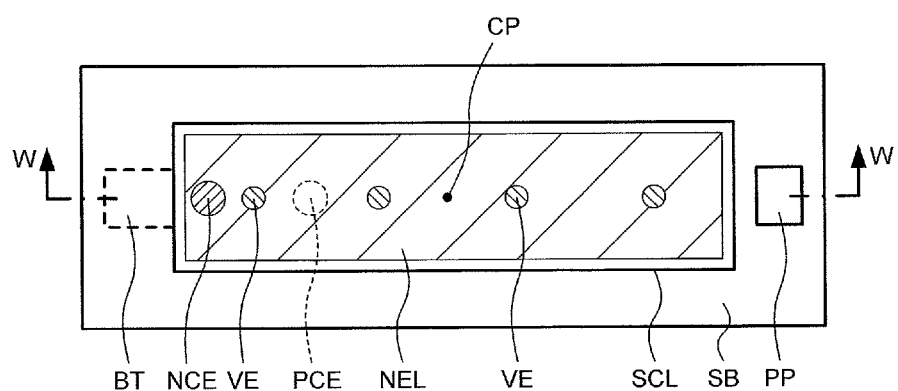
FIG. 2B is a schematic top view illustrating the semiconductor light-emitting element according to the second embodiment.

FIG. 2A is a cross-sectional view illustrating a configuration of a semiconductor light-emitting element (hereinafter simply referred to as a light-emitting element) 20 according to a second embodiment. FIG. 2B is a schematic view illustrating an upper surface of the light-emitting element 20. FIG. 2A is a cross-sectional view taken along W-W line of FIG. 2B. The light-emitting element 20 has the same configuration as the light-emitting element 10 except for the configuration of the n-electrode NE and the presence of a back surface terminal BT.

In the present embodiment, an n-electrode NE includes not only via-electrodes VE and an n-electrode layer (second electrode layer) NEL, but also an n-side contact electrode (second contact electrode) NCE connected to the n-electrode layer NEL at a position displaced to a p-side contact electrode PCE of the n-electrode layer NEL. More specifically, the n-electrode NE includes: the n-electrode NEL formed on the p-electrode layer PEL through an insulating film ISF; a plurality of via-electrodes VE extending from the n-electrode layer NEL and through the p-electrode layer PEL, a p-type semiconductor layer 11, and a light-emitting layer 12 and being connected to an n-type semiconductor layer 13; and the n-side contact electrode NCE connected to the n-electrode layer NEL at a position displaced (biased) in a direction toward the p-side contact electrode PCE from the center CP of the n-electrode layer NEL in the intra-layer direction of the n-electrode layer NEL. In the description of the present embodiment, the center CP of the p-electrode layer PEL is identical to the center CP of the n-electrode layer NEL as viewed from a direction perpendicular to the semiconductor structure layer SCL.

In the present embodiment, the n-side contact electrode NCE extends from the n-electrode layer NEL and through the insulating layer ISL and is connected to the substrate SB. On the back surface (surface without the insulating layer ISL formed thereon) of the substrate SB, a back surface terminal BT is formed. In the present embodiment, the substrate SB is formed from a conductive substrate such as Si. That is, the n-electrode NE is electrically connected to the back surface terminal BT through the substrate SB. Although the n-side pad terminal NP is used as a feed terminal to the n-type semiconductor layer 13 in the first embodiment, the back surface terminal BT functions as a feed terminal to the n-type semiconductor layer 13 in the present embodiment.

As illustrated in FIG. 2B, the light-emitting element 20 includes p-side and n-side contact electrodes PCE and NCE which are displaced in an identical direction from the center CP of the semiconductor structure layer SCL in the intra-layer direction of the semiconductor structure layer SCL. The p-electrode layer PEL and n-electrode layer NEL which function as current diffusion layers are connected to the p-side and n-side contact electrodes PCE and NCE, respectively. This makes it possible to secure current injection into the entire light-emitting layer 12, while forming a large luminance gradation in the irradiation area.

The semiconductor structure layer SCL has a rectangular shape as viewed in the direction perpendicular to the semiconductor structure layer SCL. The p-side and n-side contact electrodes PCE and NCE are each formed at positions displaced from the centers CP of the p-electrode layer PEL and the n-electrode layer NEL along the long-side direction of the semiconductor structure layer SCL. Therefore, a large luminance gradation can be formed.

[Third Embodiment]

Figure 3A:
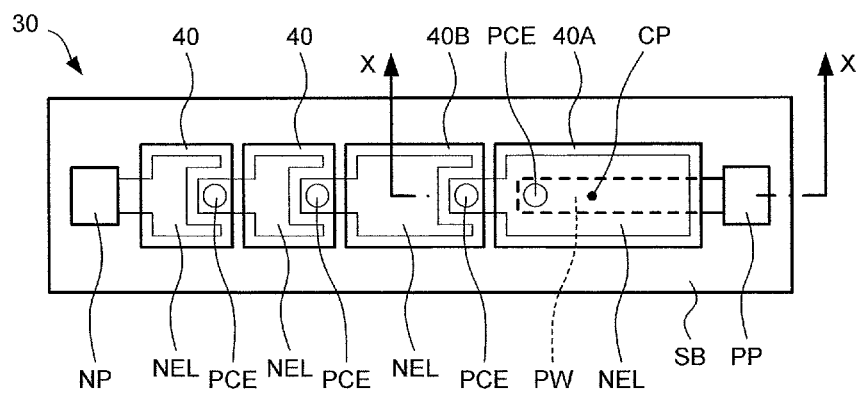
FIG. 3A is a schematic view illustrating an upper surface of a semiconductor light-emitting device according to a third embodiment.

FIG. 3A is a schematic view illustrating an upper surface of a semiconductor light-emitting device (hereinafter simply referred to as a light-emitting device) 30 according to a third embodiment. The light-emitting device 30 includes a plurality of semiconductor light-emitting elements (hereinafter simply referred to as light-emitting elements) 40 arrayed in a matrix form (in n rows and m columns, 1≤n, 1≤m) on the substrate SB. In the present embodiment, four light-emitting elements 40 are arranged in a row between the p-side and n-side pad terminals PP and NP. In the following description, among the four light-emitting elements 40, a light-emitting element 40 closest to the p-side pad terminal PP (end portion) is referred to as a light-emitting element 40A, and a light-emitting element 40 adjacent to the light-emitting element 40A is referred to as a light-emitting element 40B.

Figure 3B:
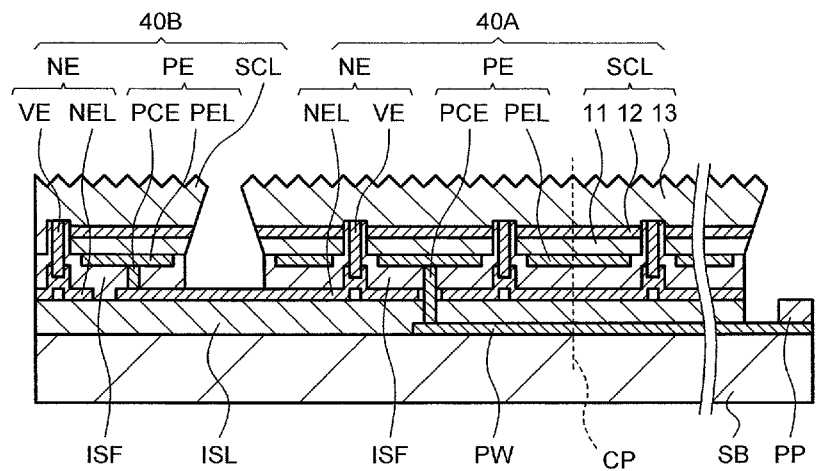
FIG. 3B is a fragmentary cross-sectional view illustrating the semiconductor light-emitting device according to the third embodiment.

FIG. 3B is a cross-sectional view of the light-emitting device 30. FIG. 3B is a cross-sectional view taken along X-X line of FIG. 3A. As illustrated in FIG. 3B, like the light-emitting element 10, the light-emitting element 40A in an end portion includes: a p-electrode (first electrode) PE comprised of a p-electrode layer (first electrode layer) PEL and a p-side contact electrode (first contact electrode) PCE; and an n-electrode (second electrode) NE comprised of an n-electrode layer (second electrode layer) NEL and via-electrodes VE. Like the light-emitting element 10, the p-electrode PE of the light-emitting element 40A is connected to the p-side pad terminal PP through a p-side wiring PW provided on the substrate SB.

The n-electrode NE of the light-emitting element 40A is connected to a p-electrode PE of the adjacent light-emitting element 40B. Specifically, the n-electrode layer NEL of the light-emitting element 40A extends between the light-emitting element 40B and the substrate SB. The p-electrode PE of the light-emitting element 40B includes a p-electrode layer PEL similar to that of the light-emitting element 10, and a p-side contact electrode PCE connected from the p-electrode layer PEL to the n-electrode layer NEL of the light-emitting element 40A. More specifically, the adjacent light-emitting elements 40A and 40B are connected in series. The light-emitting elements 40 other than the light-emitting elements 40A and 40B have the same configuration as that of the light-emitting element 40B.

Similarly, four light-emitting elements 40 are connected to adjacent light-emitting elements 40 as in the case of the light-emitting elements 40A and 40B. As illustrated in FIG. 3A, the n-electrode layer NEL in the light-emitting element 40 closest to the n-side pad terminal NP is connected to the n-side pad terminal NP. That is, the light-emitting device 30 is configured so that the plurality of light-emitting elements 40 are connected in series. Therefore, when voltage is applied between the p-side pad terminal PP and the n-side pad terminal NP, all the light-emitting elements 40 perform lighting operation at the same time.

In the present embodiment, the light-emitting element 40A in the end portion has the p-side contact electrode PCE. Therefore, a luminance gradation can be formed in an end area of the light-emitting region (element region). For example, when the light-emitting device 30 is used as lighting, a gentle luminance gradation is formed at an outer edge of the irradiation area.

Moreover, in the present embodiment, the p-side contact electrode PCE of the light-emitting element 40A is formed at a position displaced toward the adjacent light-emitting element 40B from the center of the p-electrode layer PEL. Therefore, it becomes possible to form a luminance gradation with the luminance gradually decreasing toward the outer edge of the light-emitting region. For example, when the light-emitting device 30 is used as a vehicle headlight, the center of an irradiation area (for example, a portion of illuminating the front side of the vehicle within a present lane) is required to be high in luminance, while the luminance requirements are less severe (low luminance is acceptable) with respect to the outer edge of the irradiation area (for example, a portion of illumination side roads and road signs). In such an application, the light-emitting device 30 is preferable.

The light-emitting element 40A has a rectangular shape as viewed from a direction perpendicular to the semiconductor structure layer SCL, with the long-side of the rectangular shape being in the direction toward the adjacent light-emitting element 40B. In the light-emitting element 40A, the p-side contact electrode PCE is formed at a position displaced from the center of the p-electrode layer PEL along the long-side direction of the semiconductor structure layer SCL. Therefore, a large luminance gradation is formed in the light-emitting element 40A. As a result, it becomes possible to form extraction light with the luminance decreasing largely and smoothly toward the outer edge.

Since the p-side contact electrode PCE of the light-emitting element 40A is formed at a position displaced toward the adjacent light-emitting element 40B, a high-luminance region H1 (see FIG. 1B) is formed on the light-emitting element 40B side of the light-emitting element 40A. In this case, light tends to pass through a region between the light-emitting elements 40A and 40B. Specifically, while light is not emitted from the region between the element 40A and 40B, most of the light emitted from the light-emitting element 40A tends to pass through the inter-element region in the present embodiment. Therefore, when all the light-emitting elements 40 are lit, formation of a dark part (dark line) corresponding to an inter-element region is suppressed. In the present embodiment, since the n-electrode layer NEL is pulled out toward the light-emitting element 40B which is adjacent in a direction displaced from the central point CP of the p-side contact electrode PCE, formation of the dark part is further suppressed.

In the present embodiment, it has been described that four light-emitting elements 40 are arrayed in a row. However, the number of the light-emitting elements in a row, and the number of rows and columns are not limited thereto. For example, the light-emitting elements may be arrayed in two or more rows. In that case, the light-emitting elements in the end portions may each include a p-side contact electrode PCE placed at a displaced position, or one of the light-emitting elements in the end portions may include the p-side contact electrode PCE. More specifically, among the plurality of light-emitting elements arrayed in a matrix form, at least one light-emitting element in the end portion may include the p-electrode PE and the n-electrode NE similar to those of the light-emitting element 10.

In the present embodiment, it has been described that the light-emitting element 40A has a rectangular plane shape, and the light-emitting elements 40A and 40B are arrayed in a long-side direction of the rectangular plane shape. However, the shape of the light-emitting element 40A is not limited thereto. Although it has been described that the plurality of light-emitting elements 40 are connected in series, the light-emitting elements 40 may be connected to each other in other forms. Although it has been described that the p-side contact electrode PCE is displaced toward the adjacent light-emitting element 40B, the formation position (the displacement direction) of the p-side contact electrode PCE is not limited thereto.

In the present embodiment, the light-emitting device 30 includes the plurality of light-emitting elements 40 arrayed in a matrix form on the substrate SB. Among the plurality of light-emitting elements 40, the light-emitting element 40A in the end portion includes the p-electrode PE (p-electrode layer PEL and p-side contact electrode PCE) similar to that of the light-emitting element 10. The n-electrode NE includes the n-electrode layer NEL and the via-electrodes VE. This makes it possible to provide the light-emitting device 30 with high luminous efficiency which can form a luminance gradation in the outer edge of the light-emitting region.

Figure 4A:
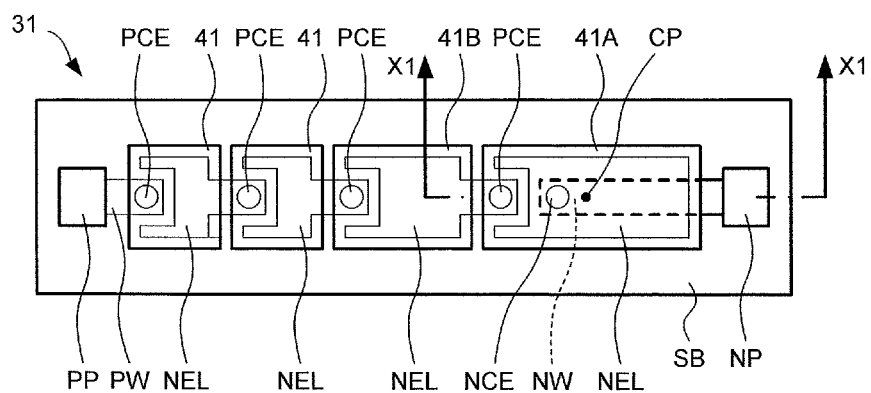
FIG. 4A is a schematic view illustrating an upper surface of a semiconductor light-emitting device according to a first modification of the third embodiment.
Figure 4B:
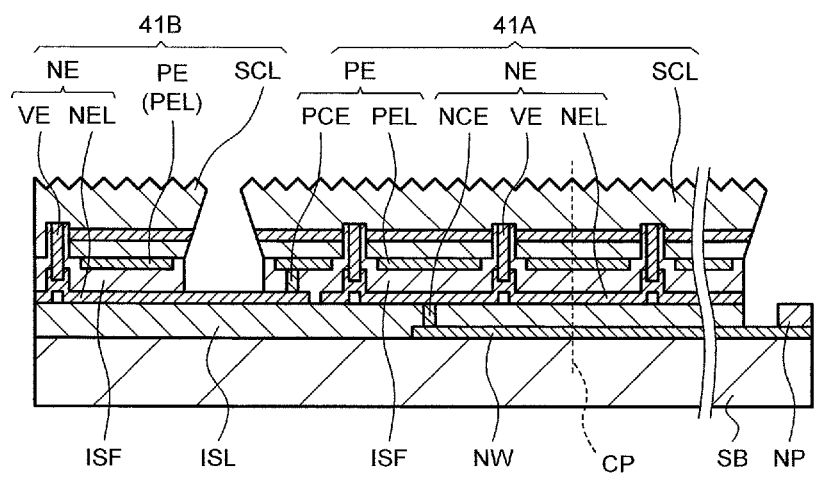
FIG. 4B is a fragmentary cross-sectional view illustrating the semiconductor light-emitting device according to the first modification of the third embodiment.

In the present embodiment, the light-emitting device 30 is configured to form a luminance gradation decreasing toward the p-side pad terminal PP. However, the direction of the gradation is not limited thereto. For example, a luminance gradation decreasing toward the n-side pad terminal NP may be formed by reversing the positions of the p-side pad terminal PP and the n-side pad terminal NP. FIG. 4A is a schematic view illustrating an upper surface of a light-emitting device 31 according to a first modification of the third embodiment. FIG. 4B is a cross-sectional view of the light-emitting device 31 taken along X1-X1 line in FIG. 4A.

The light-emitting device 31 is configured to have four light-emitting elements 41 aligned in a row between the n-side pad terminal NP and the p-side pad terminal PP. Among the light-emitting elements 41, a light-emitting element 41A closest to the n-side pad terminal NP (end portion) has the same configuration as the light-emitting element 20 in the second embodiment. An n-electrode layer NEL of a light-emitting element 41B adjacent to the light-emitting element 41A extends to the formation region of the light-emitting element 41A and is connected to a p-side contact electrode PCE of the light-emitting element 41A. Other light-emitting elements 41 have the same configuration as that of the light-emitting element 41B. The n-side contact electrode NCE of the light-emitting element 41A is connected to the n-side pad terminal NP through an n-side wiring NW.

In the present modification, the light-emitting element 41A in an end portion on the n-side pad terminal NP side includes p-side and n-side contact electrodes PCE and NCE displaced in a direction adjacent to the light-emitting element 41B. Therefore, a luminance gradation decreasing toward the n-side pad terminal NP can be formed.

The light-emitting elements 40 (for example, the light-emitting element 40B) other than the light-emitting element 40A can form a luminance gradation by adjusting the formation position of the p-side contact electrode PCE (the position of connection to the p-electrode layer PEL). For example, a luminance gradation can also be formed in the light-emitting element 40B by forming the p-side contact electrode PCE of the light-emitting element 40B at a displaced position in the intra-layer direction of the p-electrode layer PEL.

Figure 5A:
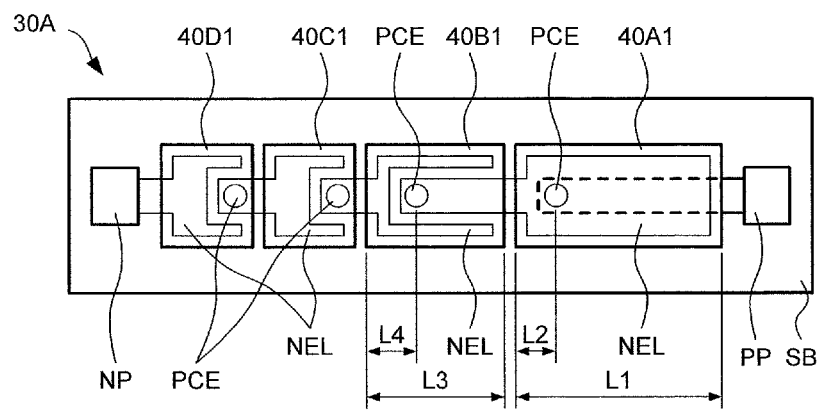
FIG. 5A is a schematic view illustrating an upper surface of a semiconductor light-emitting device according to a second modification of the third embodiment.

FIG. 5A is a schematic view illustrating an upper surface of a light-emitting device 30A according to a second modification of the third embodiment. The light-emitting device 30A has the same configuration as that of the light-emitting device 30 except for the configuration of light-emitting element 40A1 to 40D1. The light-emitting element 40A1 has the same configuration as that of the light-emitting element 40A. The light-emitting element 40B1 has the same configuration as that of the light-emitting element 40B except for the formation position of the p-side contact electrode PCE. As illustrated in FIG. 5A, the light-emitting element 40B1 includes a p-side contact electrode PCE displaced in a direction similar to a displacement direction of the p-side contact electrode PCE of the light-emitting element 40A1.

In the present modification, the two light-emitting elements 40A1 and 40B1 on the p-side pad terminal PP side each have a p-side contact electrode PCE at a displaced position. The n-electrode layer NEL in the light-emitting elements 40A1 and 40B1 is pulled in a direction similar to the displacement direction of each of the p-side contact electrodes PCE (on the n-side pad terminal NP side). Therefore, when the p-side contact electrodes PCE of other light-emitting elements 40C1 and 40D1 are formed at a central portion of the element region for example, a gradation is formed in the light-emitting elements 40A1 and 40B1, while a gradation is not formed in the light-emitting elements 40C1 and 40D1.

In the present modification, a gradation level is different between the light-emitting elements 40A1 and 40B1. Specifically, when a length of the light-emitting element 40A1 in a displacement direction of the p-side contact electrode PCE is defined as a length L1 in the light-emitting element 40A1, a length L2 from the end portion to the formation position of the p-side contact electrode PCE in the displacement direction of the light-emitting element 40A1 is configured to be ¼ of the length L1. When a length of the light-emitting element 40B1 in the displacement direction of the p-side contact electrode PCE is defined as a length L3 in the light-emitting element 40B1, a length L4 from the end portion to the formation position of the p-side contact electrode PCE in the displacement direction of the light-emitting element 40B1 is configured to be ⅓ of the length L3.

Therefore, a level of displacement of the position of the p-side contact electrode PCE in the light-emitting element 40A1 is larger than a level of displacement of the position of the p-side contact electrode PCE in the light-emitting element 40B1. As a consequence, light from the light-emitting element 40A1 has a larger gradation than light from the light-emitting element 40B1. Therefore, a natural gradation can be generated in the entire light-emitting device 30A. The level of displacement of the p-side contact electrode PCE can be adjusted on the basis of the length in the displacement direction of the light-emitting element, for example. The relationship between the lengths L1 and L2 and the relationship between the lengths L3 and L4 in the present modification are merely exemplary.

The light-emitting element 40A of the light-emitting device 30 in the present embodiment, which is used as a light-emitting element in the end portion, may be replaced with the light-emitting element 20 of the second embodiment. More specifically, the light-emitting element 40A in the end portion may include the n-side contact electrode NCE connected to the n-electrode layer NEL, and the n-side contact electrode NCE may be connected to the p-side contact electrode PCE of the light-emitting element 40B.

Figure 5B:
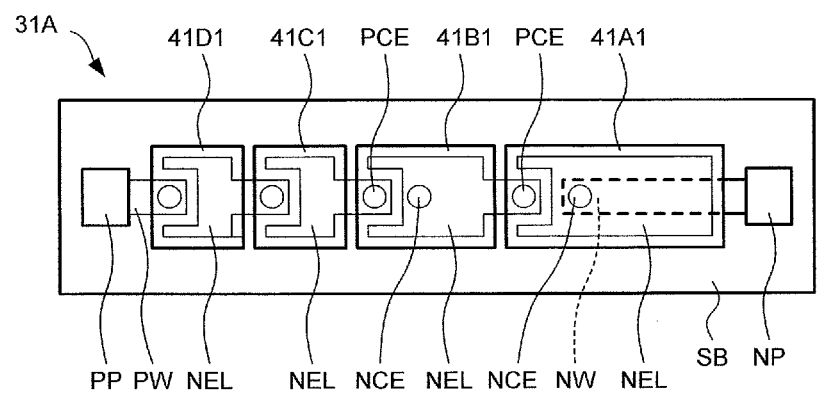
FIG. 5B is a schematic view illustrating an upper surface of a semiconductor light-emitting device according to a third modification of the third embodiment.

Furthermore, the positions of the p-side and n-side pad terminals PP and NP may be exchanged by utilizing the connection between the n-side contact electrodes NCE and the p-side contact electrodes PCE of the adjacent elements. FIG. 5B is a schematic view illustrating an upper surface of a light-emitting device 31A according to a third modification of the third embodiment. The light-emitting device 31A has the same configuration as that of the light-emitting device 31 except for the configuration of light-emitting elements 41A1 to 41D1. The light-emitting element 41A1 has the same configuration as the light-emitting element 41.

The light-emitting element 41B1 includes an n-side contact electrode NCE displaced in a direction similar to the direction of a p-side contact electrode PCE. In the present embodiment, the light-emitting elements 41C1 and 41D1 have the same configuration as the light-emitting element 41B. In the present modification, a gradation is formed in the two light-emitting elements 41A1 and 41B1 on the n-side pad terminal NP side.

It has been described that the first and second semiconductor layers are a p-type semiconductor layer and an n-type semiconductor layer, respectively, in the present embodiment and in the modifications thereof. However, the conductivity type of the first and second semiconductor layers may be reversed. That is, the first semiconductor layer may have an n-type conductivity type, and the second semiconductor layer may have a p-type conductivity type.

[Fourth Embodiment]

Figure 6A:
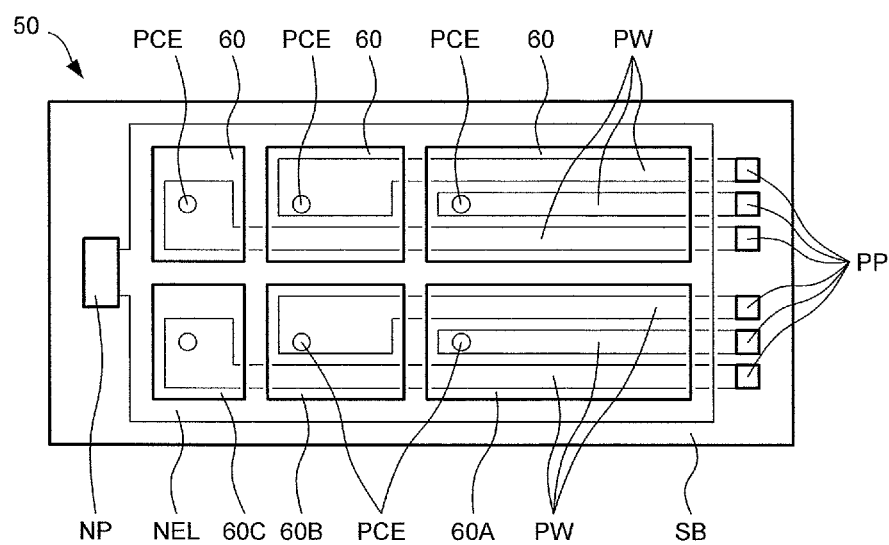
FIGS. 6A and 6B are schematic views illustrating an upper surface of a semiconductor light-emitting device according to a fourth embodiment.
Figure 6B:
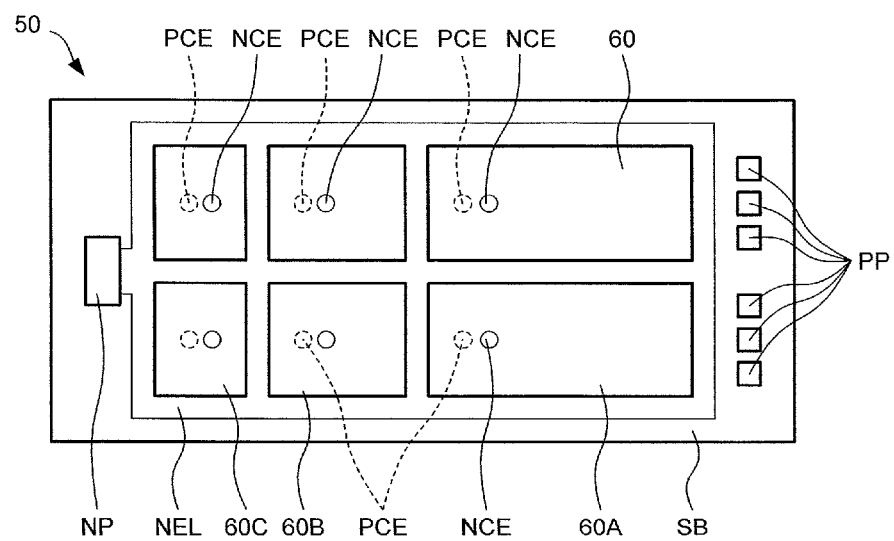

FIGS. 6A and 6B are schematic views illustrating an upper surface of a light-emitting device 50 according to a fourth embodiment. The light-emitting device 50 includes a plurality of light-emitting elements 60 arrayed in a matrix form on the substrate SB. In the present embodiment, the light-emitting device 50 has six light-emitting elements 60 formed in two rows and three columns. The light-emitting device 50 also includes p-side and n-side pad terminals PP and NP as feed terminals to the light-emitting element 60.

In the present embodiment, the light-emitting elements 60 each have the same configuration as the light-emitting element 20 (FIG. 2), for example. That is, the light-emitting device 50 has a configuration corresponding to six light-emitting elements 20 arranged (arrayed) in parallel on the substrate SB. More specifically, as illustrated in FIG. 6A, a p-electrode PE of the light-emitting element 60 includes a p-electrode layer PEL and a p-side contact electrode PCE similar to those in the light-emitting element 10. In another example, as illustrated in FIG. 6B, an n-electrode NE of the light-emitting element 60 includes an n-electrode layer NEL, via-electrodes VE, and an n-side contact electrode NCE similar to those in the light-emitting element 20.

Also in the present embodiment, the n-electrode layers NEL (n-electrodes NE) of the six light-emitting elements 60 are each connected to one n-side pad terminal NP. That is, in the present embodiment, the n-side pad terminal NP functions as a common terminal connected to the n-electrodes NE in each of the six light-emitting elements 60.

The p-side contact electrodes PCE (p-electrodes PE) of the light-emitting elements 60 are each connected to the individual p-side pad terminals PP through a p-side wiring PW. In the present embodiment, total six p-side pad terminals PP are formed, with one p-side pad terminal PP for each of the p-side contact electrodes PCE of the six light-emitting elements 60. That is, in the present embodiment, the p-side pad terminals PP function as individual terminals connected to the p-electrodes PE of the light-emitting elements 60.

In other words, in the present embodiment, the six light-emitting elements 60 are connected in parallel. The light-emitting elements 60 perform lighting on/off operation independently from each other by controlling electric supply to the p-side pad terminals PP.

In the present embodiment, all the light-emitting elements 60 are configured to be able to form a luminance gradation. Therefore, flexibility of designing the light distribution is enhanced. As illustrated in FIGS. 6A and 6B, the present embodiment is configured so that the formation positions of the p-side contact electrodes PCE gradually approach the center of the p-electrode layer PEL along a row direction of the matrix formed by the elements. That is, the present embodiment is configured so that the level of displacement of the p-side contact electrode PCE and the n-side contact electrode NCE gradually decreases. Therefore, the level of the luminance gradation is low in the center (middle) of the matrix. When the formation positions of the p-side contact electrodes PCE are adjusted in this manner, the luminance in the irradiation area can reliably be adjusted. For example, it is possible to form a gradation in which the luminance is highest in a central region of the irradiated area and gradually decreases toward the outer edge of the irradiated area.

The light-emitting device 50 also has a configuration suitable for the vehicle headlight, for example. In recent years, a headlight having a light distribution shape that is variable depending on the position of an oncoming vehicle, a preceding vehicle, a pedestrian, and the like. The light-emitting device 50 is configured to be able to control the light distribution shape in real time by independently switching electrical connection and disconnection of the light-emitting elements 60. Furthermore, the light-emitting device 50 has the configuration adequate for implementing the light distribution shape and the luminance distribution, which are required for the variable light distribution headlight.

In the present embodiment, it has been described that all the light-emitting elements 60 independently perform lighting on/off operation. However, the configuration of the light-emitting element 60 is not limited thereto. For example, the light-emitting elements 60 may be divided into segments, and lighting on/off operation may be independently performed in the segment units. Although it has been described that all the light-emitting elements 60 have the p-side contact electrodes PCE at the displaced positions, the p-side contact electrodes PCE may be formed at other positions. For example, in some of the light-emitting elements 60, the p-side contact electrode PCE may be formed in the center of the p-electrode layer PEL.

In the present embodiment, it has been described that all the light-emitting elements 60 include the n-electrode layer PEL, the via-electrodes VE, and the n-side contact electrode NCE. However, the n-electrode NE may have other configurations. For example, some of the light-emitting elements 60 may include an n-electrode NE similar to that of the light-emitting element 10.

In the above-described embodiment, the p-electrode PE includes the p-electrode layer PEL and the p-side contact electrode PCE connected to a displaced position of the p-electrode layer PEL. The n-electrode NE extends through the p-electrode layer PEL, the p-type semiconductor layer 11, and the light-emitting layer 12 and is connected to the n-type semiconductor layer 13. Therefore, the light-emitting element having a luminance gradation can be obtained. As a result, an irradiation area comfortable for an observer can be provided.

This application is based on a Japanese Patent application No. 2015-104538 which is hereby incorporated by reference.

What is claimed is:

1. A semiconductor light-emitting element comprising:
a substrate;
a semiconductor structure layer including a first semiconductor layer having a first conductivity type, a light-emitting layer, and a second semiconductor layer having a second conductivity type opposite to the first conductivity type, the first semiconductor layer, the light-emitting layer, and the second semiconductor layer being laminated in sequence on the substrate;
a first electrode including (i) a first electrode layer formed between the substrate and the first semiconductor layer, and (ii) a first contact electrode connected to the first electrode layer at a position displaced from a center of the first electrode layer in an intra-layer direction of the first electrode layer; and
a second electrode including (i) a second electrode layer formed between the substrate and the first electrode layer with an insulating film interposed between the second electrode layer and the first electrode layer, and (ii) a plurality of via-electrodes each extending through the first electrode layer, the first semiconductor layer, and the light-emitting layer, the plurality of via-electrodes connecting the second electrode layer and the second semiconductor layer,
wherein the second electrode layer extends along a direction from the center of the first electrode layer towards the first contact electrode and extends beyond the first contact electrode such that a portion of the second electrode layer is exposed from the semiconductor structure layer on the substrate.

2. The semiconductor light-emitting element according to claim 1, wherein:
the semiconductor structure layer has a rectangular shape as viewed in a direction perpendicular to the semiconductor structure layer, and
the first contact electrode is formed at a position displaced from the center of the first electrode layer along a long-side direction of the semiconductor structure layer.

3. The semiconductor light-emitting element according to claim 1, wherein the plurality of via-electrodes are arranged at regular intervals in an intra-layer direction of the second semiconductor layer.

4. The semiconductor light-emitting element according to claim 2, wherein the plurality of via-electrodes are arranged at regular intervals in an intra-layer direction of the second semiconductor layer.

5. The semiconductor light-emitting element according to claim 1, wherein:
the second electrode layer is connected to a pad terminal, and
the pad terminal is connected to an external power supply through a bonding wire.

6. The semiconductor light-emitting element according to claim 2, wherein:
the second electrode layer is connected to a pad terminal, and
the pad terminal is connected to an external power supply through a bonding wire.

7. The semiconductor light-emitting element according to claim 1, wherein the plurality of via-electrodes are formed at intervals in an intra-layer direction of the second semiconductor layer, and the first contact electrode is formed between the plurality of via-electrodes.

8. The semiconductor light-emitting element according to claim 2, wherein the plurality of via-electrodes are formed at intervals in an intra-layer direction of the second semiconductor layer, and the first contact electrode is formed between the plurality of via-electrodes.

9. A semiconductor light-emitting element comprising:
   a semiconductor structure layer including a first semiconductor layer having a first conductivity type, a light-emitting layer, and a second semiconductor layer having a second conductivity type opposite to the first conductivity type, the first semiconductor layer, the light-emitting layer, and the second semiconductor layer being laminated in sequence;
   a first electrode including (i) a first electrode layer formed on the first semiconductor layer, and (ii) a first contact electrode connected to the first electrode layer at a position displaced from a center of the first electrode layer in an intra-layer direction of the first electrode layer; and
   a second electrode including (i) a second electrode layer formed on the first electrode layer with an insulating film interposed therebetween, and (ii) a plurality of via-electrodes each extending through the first electrode layer, the first semiconductor layer, and the light-emitting layer, the plurality of via-electrodes connecting the second electrode layer and the second semiconductor layer,
   wherein the plurality of via-electrodes are formed at intervals along a direction from the center of the first electrode layer towards the first contact electrode within the same semiconductor structure layer, and the first contact electrode is provided between an adjacent two of the plurality of via-electrodes.

* * * * *